United States Patent

Tsai et al.

[11] Patent Number: 5,851,603
[45] Date of Patent: Dec. 22, 1998

[54] METHOD FOR MAKING A PLASMA-ENHANCED CHEMICAL VAPOR DEPOSITED SIO₂ SI₃N₄ MULTILAYER PASSIVATION LAYER FOR SEMICONDUCTOR APPLICATIONS

[75] Inventors: Kwong-Jr Tsai, Chung-Hsung; Shiang-Peng Cheng, Hsinchu; Yeur-Luen Tu, Taipei; Ing-Ruey Liaw, Hsinchu, all of Taiwan

[73] Assignee: Vanguard International Semiconductor Corporation, Hsin-Chu, Taiwan

[21] Appl. No.: 891,910

[22] Filed: Jul. 14, 1997

[51] Int. Cl.⁶ ..................................................... B05D 3/06
[52] U.S. Cl. ..................... 427/579; 427/578; 427/255.7; 438/938; 438/763; 438/624
[58] Field of Search ..................... 427/578, 579, 427/255.7, 402; 438/958, 624, 763

[56] References Cited

U.S. PATENT DOCUMENTS

| | | | |
|---|---|---|---|
| 4,692,786 | 9/1987 | Lindenfelser | 357/54 |
| 4,707,721 | 11/1987 | Ang et al. | 357/54 |
| 5,393,709 | 2/1995 | Lur et al. | 438/763 |
| 5,677,562 | 10/1997 | Korwin-Pawlowski et al. | 257/490 |

FOREIGN PATENT DOCUMENTS

| | | |
|---|---|---|
| 63-028049 | 2/1988 | Japan . |
| 1-045132 | 2/1989 | Japan . |

*Primary Examiner*—Roy V. King
*Attorney, Agent, or Firm*—George O. Saile; Stephen B. Ackerman

[57] ABSTRACT

A method was achieved for forming a multilayer passivation layer comprised of a silicon oxide/silicon nitride/silicon oxide/silicon nitride by depositing the layers consecutively in a single PECVD system. The method consists of depositing a first $SiO_2$ layer that serves as a stress-release layer, a thin $Si_3N_4$ layer that serves as a buffer layer that minimizes cracking and as a passivation layer that prevents mobile alkaline ion penetration, a thin second $SiO_2$ layer to fill and seal any remaining cracks and pinholes in the first $Si_3N_4$ layer, and a main $Si_3N_4$ passivation layer that prevents water and/or other corrosive chemicals from attacking the metal. Since this multilayer passivation layer can be deposited essentially pinhole-free to a thickness that is less than the prior art's passivation layer of 8000 Angstroms needed to prevent pinholes, it can be used on 0.38 to 0.25 um DRAM technology, which eliminates voids that could otherwise trap photoresist which can later cause corrosion of the metal lines.

18 Claims, 2 Drawing Sheets

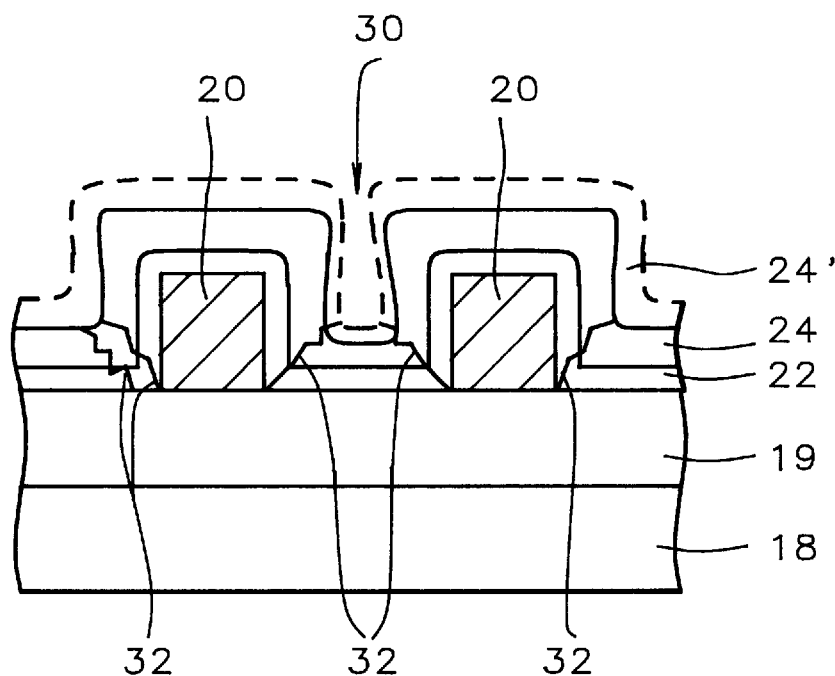
FIG. 1 - Prior Art
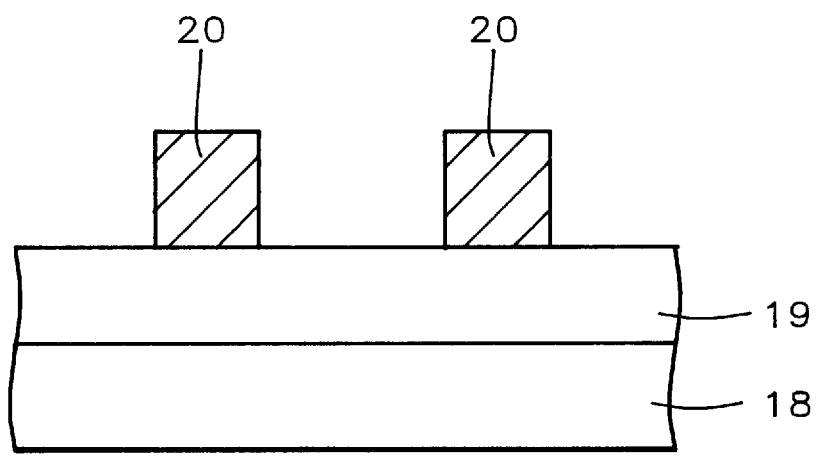
FIG. 2

METHOD FOR MAKING A PLASMA-ENHANCED CHEMICAL VAPOR DEPOSITED SIO₂ SI₃N₄ MULTILAYER PASSIVATION LAYER FOR SEMICONDUCTOR APPLICATIONS

BACKGROUND OF THE INVENTION (1) Field of the Invention

The present invention relates to a method for making a plasma-enhanced chemical vapor deposited (PECVD) silicon oxide/silicon nitride multilayer (stacked layer) as a passivation layer on semiconductor integrated circuits, and more particularly relates to a method for making an insulating/passivating layer over interconnecting metal lines on multilevel interconnections for integrated circuits.

(2) Description of the Prior Art

Multilevels of metal interconnections are used on Ultra Large Scale Integration (ULSI) integrated circuits to wire-up the discrete semiconductor devices on the semiconductor chips. The different levels of interconnections are separated by layers of insulating material, such as PECVD silicon oxide ($SiO_2$) and silicon nitride ($Si_3N_4$) layers. The silicon nitride also serves as a barrier layer or passivation layer to prevent contamination from moisture and other corrosive chemicals, and to prevent ionic contamination from light alkaline metal ions, such as sodium (Na) and potassium (K) which can degrade the electrical characteristics of the underlying semiconductor devices built in and on the substrate. Via holes etched in the interposed insulating/passivation layers are used to connect one level of metal to the next. Typically the insulation and passivation layers require low-temperature deposition processing (<400° C.) because the metal lines which are usually formed from Al/Cu alloys have a low melting temperature (about 660° C.).

Unfortunately, as the metal lines that form the interconnections are made closer together to satisfy the higher packing density for ULSI integrated circuits, the aspect ratio (the width of the spacings between metal lines to the metal thickness) increases. This can result in the formation of voids (keyholes) in the nonconformal insulating or passivation layer between the metal lines when the passivation is deposited next. Also because the silicon nitride has a higher stress than the silicon oxide, cracking of the silicon nitride layer is prevalent at the bottom corners in the recesses between the metal lines. The voids are particularly prevalent when the passivation layer, usually a silicon nitride, is deposited at low temperatures, such as by PECVD or high-density plasma CVD (HDP-CVD) that results in the nonconformal layer.

The void and cracking problems are best understood by referring to the prior art in FIG. 1, which is a schematic cross-sectional view of a portion of a partially completed semiconductor substrate 18, such as a silicon substrate with an insulating layer 19 on the surface. The underlying semiconductor devices, such as field effect transistors (FETs) and electrical interconnections are not depicted to simplify the drawing and discussion. Two closely spaced interconnecting metal lines 20 are shown on which is deposited first a thin PECVD silicon oxide layer 22 that acts as a stress-release layer for the $Si_3N_4$ layer 24 which is deposited next. As is depicted in FIG. 1, the deposition flux of the deposited $Si_3N_4$ layer is higher at the top corners of the closely spaced metal lines than in the recess between them. This results in the formation of voids 30 having a keyhole shape. If the $Si_3N_4$ is deposited to a thickness 24', as depicted by the broken line 24', then the voids can be partially closed. During the next photoresist masking step to form the via holes in the passivation layer to the metal lines elsewhere on the substrate 18 (not shown), residual photoresist can be trapped in the voids 30 in the $Si_3N_4$ layer 24. The incomplete removal of the residual photoresist then results in contamination and corrosion of the subsequent metal layer when the trapped photoresist outgases during the subsequent metal or alloy deposition step. Concurrently, stress-induced cracks 32 are formed in the silicon nitride layer 24 at the bottom edges of the metal lines 20, as is also depicted in FIG. 1. This is a particularly serious problem for 0.38 micrometer DRAM devices (0.38 um FET channel lengths) when the minimum spacings between the metal lines at the second metal level (M2) of interconnections are less than 0.575 um. The passivation layer typically fails the pinhole test when the total thickness of the silicon oxide layer 22 and the silicon nitride layer 24 is less than 8000 Angstroms, but thicker passivation layers can present a keyhole problem.

One method for depositing a passivation layer is described by Lindenfelser in U.S. Pat. No. 4,692,786, in which a three-layer sandwich passivation coating is deposited directly on the silicon substrate to prevent ion contamination during the fabrication of bipolar transistors, but he does not address the above keyhole or $Si_3N_4$ cracking problems. Ang et al., U.S. Pat. No. 4,707,721, describe a method for making a passivated dual-gate system using a titanium nitride which is a good electrical conductor, but do not address the keyhole or cracking problem in a silicon nitride passivation layer.

There is still a strong need in the semiconductor industry to provide a silicon nitride passivation layer over closely spaced metal lines that eliminates the above keyholes and cracking problems on future ULSI and VLSI circuits.

SUMMARY OF THE INVENTION

A principal object of the present invention is to provide a silicon oxide/silicon nitride/silicon oxide/silicon nitride multilayer which improves the passivation layer by reducing cracks in the nitride and the number of pinholes in the passivation layer.

Another object of the present invention is to provide a multilayer passivation layer, the total thickness of which can be less than the prior art passivation layer composed of a single silicon oxide and silicon nitride, thereby minimizing the voids problem in the passivation layer between metal lines.

It is another object of this invention to provide a sequential deposition process that can be carried out in a single PECVD system thereby providing a very cost-effective manufacturing process.

Briefly, this invention utilizes a sequence of processing steps to deposit a multilayer passivation layer composed of a first silicon oxide stress-release layer, a thin first silicon nitride layer to prevent ionic contamination, a thin second silicon oxide layer that fills and seals any remaining cracks and pinholes in the first silicon nitride layer, and a thicker main passivating silicon nitride layer.

The invention starts by providing a semiconductor substrate having partially completed integrated circuits consisting, for example, of field effect transistors (FETs) and having interconnecting metal layers. Although $SiO_2/Si_3N_4/SiO_2/Si_3N_4$ is used typically as a passivation layer on the second level of patterned metal lines (M2) prior to forming the pad contacts on DRAM devices, it should be understood that the method is generally applicable where a passivation layer over closely spaced metal lines is required. Next, a metal layer, such as aluminum/copper (Al/Cu) is deposited on the substrate having an insulating layer over the underlying devices, and patterned to form the narrow spaced metal lines, such as M2 on DRAMs. A thin first silicon oxide layer is deposited in a PECVD system using silane ($SiH_4$) and nitrous oxide ($N_2O$) as the reactant gases, and provides a stress-release layer for a thin first silicon nitride layer that is deposited next. The thin first silicon nitride layer serves as a buffer layer, which prevents penetration of mobile alkaline ions, such as Na and K, and minimizes cracking since this nitride is a thin layer. A relatively thin second silicon oxide layer is deposited on the first silicon nitride layer to fill and seal any remaining cracks and pinholes in the first silicon nitride layer. The second silicon oxide layer is deposited in the same PECVD system using $SiH_4$ and $N_2O$. A thicker main passivation layer is formed by depositing a second silicon nitride layer on the second silicon oxide layer using $SiH_4$, ammonia ($NH_3$), and nitrogen ($N_2$) to further protect the metal lines from moisture and corrosive chemicals. This provides a passivation layer that is essentially pinhole-free, while reducing the total thickness of the passivation layer from the required 8000 Angstroms for the prior art to about 5000 Angstroms or less. This allows the process to be used on narrowly spaced lines, such as the M2 level on 0.38 um DRAMs.

BRIEF DESCRIPTION OF THE DRAWINGS

The objects and other advantages of this invention are best understood with reference to the preferred embodiment when read in conjunction with the following drawings.

FIG. 1 is a schematic cross-sectional view of the prior art showing the formation of cracks in the thick silicon nitride layer and the formation of voids that can trap photoresist.

FIG. 2 shows a schematic cross-sectional view of a pair of closely spaced metal lines on an insulated substrate on which the improved passivation layer of this invention will be formed.

DESCRIPTION OF THE PREFERRED EMBODIMENT

Figure 3:
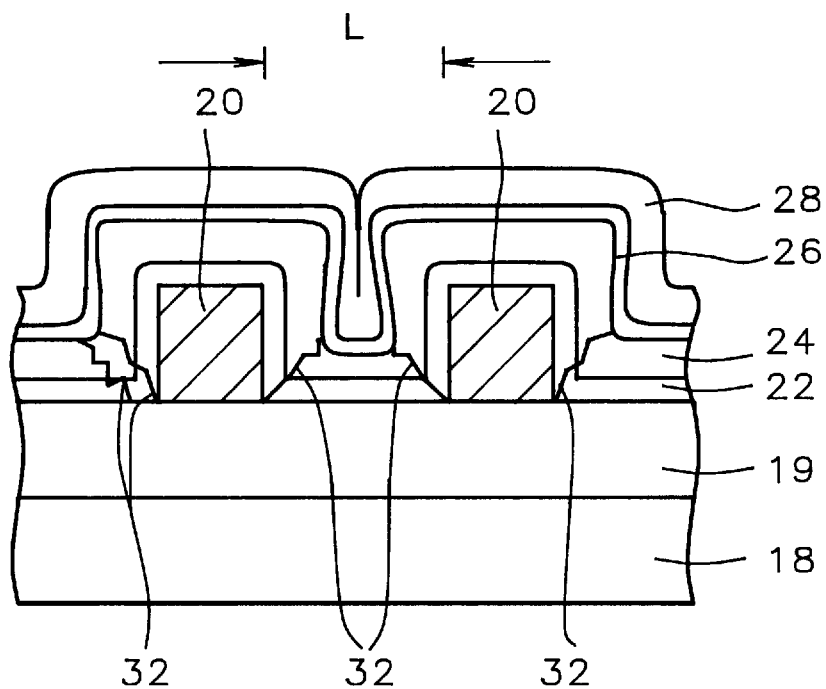
FIG. 3 is a schematic cross-sectional view of FIG. 2, and includes the improved passivation layer of this invention.

The present invention relates to a method for fabricating an improved silicon oxide/silicon nitride/silicon oxide/silicon nitride stacked (multilayer) passivation layer over closely spaced metal lines used for the metal electrical interconnections of ULSI circuits on semiconductor substrates. The method utilizes a sequence of process steps which are carried out consecutively in a single plasma-enhanced chemical vapor deposition (PECVD) system that minimizes cracking in the silicon nitride layer, and further fills and seals any remaining cracks in the silicon nitride. Also, the method reduces the trapping of residual photoresist in voids in the passivation layer between the metal lines at the next processing step when a photoresist mask is used to etch bonding pad opening (via holes) in the passivation layer. Although the method is particularly applicable to DRAM technology having minimum feature sizes of 0.38 microns (um) to 0.25 um and second level metal spacings between 0.575 and 0.475 um, it should be well understood by one skilled in the art that the method is generally applicable to narrowly spaced metal lines for other circuit applications.

Referring to FIG. 2, a schematic cross-sectional view is shown of a portion of a semiconductor substrate 18. The semiconductor substrate 18 is typically composed of single crystal silicon having a <100> crystallographic orientation, in and on which are built the active devices, such as field effect transistors (FETs). Additional patterned layers of polysilicon and/or metal lines are formed to partially complete the integrated circuits, such as on DRAMs, but this underlying circuit structure is not depicted in the Figs. to simplify the drawings and the discussion. An insulating layer 19, such as a chemical vapor deposited (CVD) silicon oxide, is deposited to electrically insulate any underlying partially completed integrated circuits (not explicitly shown in FIG. 2) before depositing and patterning the next level of metal to form the next level of metal interconnections.

Still referring to FIG. 2, the next level of metal interconnections is formed by depositing a metal layer 20 on the substrate 18 having on its surface the insulating layer 19. Typically the metal is composed of aluminum/copper (Al/Cu) alloy, which can be deposited, for example, by physical vapor deposition (PVD) such as by sputtering, and depending on the metal level, would vary in thickness. For example, when the metal layer forms the second level of metallization for a DRAM, the thickness would be between about 9000 and 11000 Angstroms.

Now by the method of this invention, and referring to FIG. 3, the multilayer passivation layer comprised of a thin first silicon oxide ($SiO_2$) layer 22, a relatively thin silicon nitride ($Si_3N_4$) layer 24, a second relatively thin $SiO_2$ layer 26, and a main $Si_3N_4$ passivation layer 28 is deposited over the metal lines 20 by the sequence of processing steps shown in Table I. The process sequence is preferably performed in a model P5000 PECVD reactor manufactured by Applied Materials Corporation of Calif., U.S.A. Alternatively a similar multilayer passivation layer can also be achieved in other deposition systems, such as high-density plasma-CVD (HDP-CVD) reactors built by the Novellus System Inc. of Calif., USA.

TABLE I

| | Column | | | | | | |
|---|---|---|---|---|---|---|---|
| | 1 | 2 | 3 | 4 | 5 | 6 | 7 |
| Steps | First $SiO_2$ | Stabilize | First $Si_3N_4$ | Stabilize | Second $SiO_2$ | Stabilize | Second $Si_3N_4$ |
| 1) Time | 3.0 | 10 | 9 | 10 | 3.0 | 10 | 45 |
| 2) Press. | 2.5 | 4.2 | 4.2 | 2.5 | 2.5 | 4.2 | 4.2 |
| 3) Power | 230 | 0 | 690 | 0.0 | 230 | 0 | 690 |
| 4) $N_2O$ | 1600 | 0 | 0 | 1600 | 1600 | 0 | 0 |
| 5) $SiH_4$ | 90 | 270 | 270 | 90 | 90 | 270 | 270 |
| 6) $NH_3$ | 0 | 110 | 110 | 0 | 0 | 110 | 110 |
| 7) $N_2$ | 0 | 4000 | 4000 | 0 | 0 | 4000 | 4000 |

TABLE I-continued

| | Column | | | | | | |
|---|---|---|---|---|---|---|---|
| Steps | 1<br>First<br>SiO$_2$ | 2<br>Stabilize | 3<br>First<br>Si$_3$N$_4$ | 4<br>Stabilize | 5<br>Second<br>SiO$_2$ | 6<br>Stabilize | 7<br>Second<br>Si$_3$N$_4$ |
| 8) Spacing | 430 | 600 | 600 | 430 | 430 | 600 | 600 |
| 9) Temp | 400 | 400 | 400 | 400 | 400 | 400 | 400 |

The columns 1 through 7, respectively, show the deposition of the CVD-SiO$_2$ layer 22 (col 1), a first stabilizing step during gas changeover to silane (SiH$_4$), ammonia (NH$_3$), and nitrogen (N$_2$) (col. 2), the first CVD-Si$_3$N$_4$ deposition step (col. 3), followed by a second stabilizing step (col. 4) in which the gas mixture is changed to nitrous oxide (N$_2$O) and SiH$_4$, a second CVD-SiO$_2$ deposition step (col. 5), a third stabilizing step (col. 6) in which the gas mixture is changed to SiH$_4$, NH$_3$, and N$_2$, and a second CVD-Si$_3$N$_4$ layer is deposited (col. 7). The stabilization cycles (cols. 2, 4, and 6) are provided for purging out the previous gases before introducing the new gas mixtures, and allows time for changing the gas mixtures before continuing the process steps. The rows 1 through 10 show the processing parameters, wherein the Time is in seconds, the Pressure (press.) is in milliTorr, the Power is in Watts, the gas flow rates (rows 4–7) are in standard cubic centimeters per minute (sccm). The Spacings between the top electrode and bottom electrode of the HDP-CVD reactor is in millimeters (row 8), and the deposition temperature (Temp.) is in degrees centigrade (0° C.) (row 9).

Still referring to FIG. 3, the first CVD-silicon oxide layer 22 (col. 1) is deposited to a thickness of between about 200 and 500 Angstroms, and more specifically to a thickness of 300 Angstroms. Layer 22 serves as the stress release layer between the metal lines 20 and the first silicon nitride layer 24, which is deposited next.

After a 10 second stabilization cycle (col. 2), a relatively thin first silicon nitride layer 24 is deposited. Layer 24 is deposited to a preferred thickness of between about 500 and 1000 Angstroms, and more specifically to a thickness of 800 Angstroms. The nitride layer 24 is thin to minimize the stress and therefore to reduce the number of cracks 32, as depicted in FIG. 3, that can form in the silicon nitride layer 24 at the bottom corners of the metal lines 20. The thin first silicon nitride layer 24 serves as a buffer layer, which prevents penetration of mobile alkaline ions, such as sodium (Na) and potassium (K).

A relatively thin second silicon oxide layer 26 is deposited on the first silicon nitride layer 24. Layer 26 fills and seals any remaining cracks and pinholes in the first silicon nitride layer 24. The second silicon oxide layer is deposited to a thickness of between about 200 and 500 Angstroms, and more specifically to a thickness of 300 Angstroms. The SiO$_2$ layer 26 also serves as a stress-release layer for the second Si$_3$N$_4$ layer which is deposited next.

Still referring to FIG. 3, a main passivation layer is formed by depositing a thicker second silicon nitride layer 28 on the second SiO$_2$ layer 26 using SiH$_4$, ammonia (NH$_3$), and nitrogen (N$_2$). Layer 28 further protects the metal lines 20 from moisture and/or corrosive chemicals. However, the total thickness of the multilayer passivation layer can be made thinner than the more conventional SiO$_2$/Si$_3$N$_4$ passivation layer. This allows the total thickness of the multilayer passivation layer to be less than the spacing L between the metal lines 20, while providing an essentially pinhole-free passivation multilayer. This thinner multilayer also minimizes the formation of voids, such as the void 30 shown in FIG. 1 of the prior art that can trap photoresist.

By way of example, for a DRAM technology having minimum feature sizes of 0.38 um (FET channel length), the spacing L is 0.575 um for the second level of metal interconnections. By the method of this invention, the thickness of the four layers (layers 22–28) that make up the passivation multilayer can be about 5000 Angstroms or less. Further, for a DRAM technology having minimum feature sizes of 0.25 um where the spacing L is about 0.475 for the second level of metal interconnections, the thickness of the passivation multilayer can be reduced further to about 4000 by decreasing the thickness of layers 22–28, and more specifically by depositing the second silicon nitride layer 28 to a thickness of about 2800 Angstroms.

Since the process steps are performed consecutively in a single PECVD system, the process time is approximately 90 seconds, which provides a cost-effective manufacturable process.

To better appreciate the advantages of this invention which uses a passivation layer composed of a multilayer of SiO$_2$/Si$_3$N$_4$/SiO$_2$/Si$_3$N$_4$, an example is given of a pinhole test to determine the pinhole-process yield.

EXAMPLE

To verify the improvement in the number of pinholes, sample chips having the second metal pattern for a 16 megabit DRAM chip and the passivation multilayer as described above in the specification were tested. The passivation multilayer consisted of a first and a second SiO$_2$ layer of 300 Angstroms each, a first Si$_3$N$_4$ layer of 800 Angstroms, and a second Si$_3$N$_4$ layer of 3800 Angstroms. The sample chips were subjected to a pressure-cooker test and a temperature-cycling test, and then a pinhole test was performed using 10% by weight of potassium hydroxide (KOH) in water at 45° C. for 30 minutes, and were then visually inspected by noting the color change of the metal lines where pinholes occur. For the pressure-cooker test (PCT), the sample chips were subjected to an ambient having a pressure of 15 pounds per square inch (psi), at a temperature of 121° C., and at a relative humidity of 100% for 96 hours and for 168 hours. 100% of the sample chips passed the pinhole test which was based on a zero number of pinholes per sample. The temperature-cycling test (TCT) was carried out in which the sample chips were subjected to a temperature cycle between −65° C. to +150° C. and back to −65° C. for 10 minute intervals at each temperature. The samples were cycled for 200 and 500 cycles. 100% of sample chips passed the pinhole test. By comparison the structures built by the prior art method had a PCT (pressure cycle test) fail rate 3 pinholes per 100 samples chips and a TCT (temperature cycle test) of 30 pinholes per 100 sample chips which failed the required reliability specification of 1 pinhole per 55 sample chips.

While the invention has been particularly shown and described with reference to the preferred embodiment thereof, it will be understood by those skilled in the art that various changes in form and details may be made without departing from the spirit and scope of the invention.

What is claimed is:

1. A method for fabricating a multilayer passivation layer over metal interconnections on a substrate comprising the steps of:

depositing a metal layer on said substrate;

patterning said metal layer forming metal lines for said metal interconnections; and further depositing sequentially said multilayer passivation layer by plasma-enhanced chemical vapor deposition (PECVD) consisting of;

depositing a first silicon oxide layer on said patterned metal layer, depositing a first silicon nitride layer on said first silicon oxide layer, depositing a second silicon oxide layer on said first silicon nitride layer thereby filling and sealing cracks and pinholes in said first silicon nitride layer, depositing a second silicon nitride layer on said second silicon oxide layer thereby providing a main passivation layer and completing said multilayer passivation layer.

2. The method of claim 1, wherein said metal layer is composed of aluminum/copper alloy having a thickness of between about 9000 and 11000 Angstroms.

3. The method of claim 1, wherein said plasma-enhanced chemical vapor deposition is carried out in an Applied Materials P5000 system.

4. The method of claim 1, wherein said plasma-enhanced chemical vapor deposition is carried out in a high-density plasma chemical vapor deposition system.

5. The method of claim 1, wherein said first and second silicon oxide layers are deposited using a gas mixture of nitrous oxide ($N_2O$) and silane ($SiH_4$).

6. The method of claim 1, wherein said first silicon oxide layer is deposited to a thickness of between about 200 and 500 Angstroms.

7. The method of claim 1, wherein said second silicon oxide layer is deposited to a thickness of between about 200 and 500 Angstroms.

8. The method of claim 1, wherein said first and second silicon nitride layers are deposited using a gas mixture of silane ($SiH_4$), ammonia ($NH_3$), and nitrogen ($N_2$).

9. The method of claim 1, wherein said first silicon nitride layer is deposited to a thickness of between about 500 and 1000 Angstroms.

10. The method of claim 1, wherein said second silicon nitride layer is deposited to a thickness of between about 2500 and 5000 Angstroms.

11. A method for fabricating a multilayer passivation layer over metal interconnections on a substrate comprising the steps of:

depositing a metal layer on said substrate;

patterning said metal layer forming metal lines for said metal interconnections; and further depositing sequentially said multilayer passivation layer by plasma-enhanced chemical vapor deposition (PECVD) consisting of;

depositing a first silicon oxide layer on said patterned metal layer using silane ($SiH_4$) and nitrous oxide ($N_2O$) thereby forming a stress-release layer, depositing a first silicon nitride layer on said first silicon oxide layer using silane, ammonia, and nitrogen, depositing a second silicon oxide layer on said first silicon nitride layer thereby filling and sealing cracks and pinholes in said first silicon nitride layer, wherein said second silicon oxide layer is deposited using silane and nitrous oxide, depositing a second silicon nitride layer on said second silicon oxide layer using silane, ammonia, and nitrogen, thereby providing a main passivation layer and completing said multilayer passivation layer.

12. The method of claim 11, wherein said metal layer is composed of aluminum/copper alloy having a thickness of between about 9000 and 11000 Angstroms.

13. The method of claim 11, wherein said plasma-enhanced chemical vapor deposition is carried out in an Applied Materials P5000 system.

14. The method of claim 11, wherein said plasma-enhanced chemical vapor deposition is carried out in a high-density plasma chemical vapor deposition system.

15. The method of claim 11, wherein said first silicon oxide layer is deposited to a thickness of between about 200 and 500 Angstroms.

16. The method of claim 11, wherein said second silicon oxide layer is deposited to a thickness of between about 200 and 500 Angstroms.

17. The method of claim 11, wherein said first silicon nitride layer is deposited to a thickness of between about 500 and 1000 Angstroms.

18. The method of claim 11, wherein said second silicon nitride layer is deposited to a thickness of between about 2500 and 5000 Angstroms.

* * * * *